(12) United States Patent
Tang

(10) Patent No.: US 8,777,641 B2
(45) Date of Patent: Jul. 15, 2014

(54) CONNECTOR, PCB FOR LED LIGHT BAR AND LED LIGHT BAR

(75) Inventor: GuoFu Tang, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 121 days.

(21) Appl. No.: 13/376,189

(22) PCT Filed: Dec. 2, 2011

(86) PCT No.: PCT/CN2011/083342
§ 371 (c)(1),
(2), (4) Date: Dec. 4, 2011

(87) PCT Pub. No.: WO2013/075357
PCT Pub. Date: May 30, 2013

(65) Prior Publication Data
US 2013/0130520 A1    May 23, 2013

(30) Foreign Application Priority Data
Nov. 21, 2011   (CN) .......................... 2011 1 0371577

(51) Int. Cl.
*H01R 12/00* (2006.01)

(52) U.S. Cl.
USPC .......................................................... 439/83

(58) Field of Classification Search
USPC .............. 439/83, 607, 660; 174/250; 362/221
See application file for complete search history.

(56) References Cited

U.S. PATENT DOCUMENTS

| | | | |
|---|---|---|---|
| 4,479,686 A * | 10/1984 | Hoshino et al. ................. | 439/78 |
| 6,682,365 B1 | 1/2004 | Walker et al. | |
| 2008/0045084 A1 * | 2/2008 | Chang ........................... | 439/607 |
| 2009/0075519 A1 | 3/2009 | Daily et al. | |
| 2012/0069569 A1 * | 3/2012 | Que .......................... | 362/249.02 |
| 2013/0059475 A1 * | 3/2013 | Shi et al. ....................... | 439/626 |

FOREIGN PATENT DOCUMENTS

| | | |
|---|---|---|
| CN | 101282618 A | 10/2008 |
| CN | 101841090 A | 9/2010 |
| CN | 201652256 U | 11/2010 |
| CN | 201779469 U | 3/2011 |
| JP | 7-211408 A | 8/1995 |
| WO | WO2011122396 A1 | 10/2011 |
| WO | WO2011132577 A1 | 10/2011 |

OTHER PUBLICATIONS

Yang Yan, the International Searching Authority written comments, Aug. 2012, CN.
Wang Shuiying, the first office action, Jun. 2013, CN.

* cited by examiner

*Primary Examiner* — Renee S Luebke
*Assistant Examiner* — Larisa Tsukerman
(74) *Attorney, Agent, or Firm* — IPro, Inc.; Na Xu

(57) ABSTRACT

The present invention discloses a connector, PCB for LED Light Bar and LED Light Bar. The connector comprises the weld legs and stitches fixed to the shell of the connector, and the weld legs are arranged on the side of the connector and are higher than the bottom surface. A PCB for LED light bar is provided with the installing groove for installing the connector. Because the present invention arranges the weld legs of the connector on positions which are higher than the bottom surface of the shell and arranges the installing groove corresponding to the bottom shape of the connector on the PCB, the bottom of the connector can be arranged in the installing groove, thus the protrusion height of the connector in the LED light bar is reduced. The LGP is not cut again when installing the LGP, thereby reducing the processing step. In addition, the depth that the connector sinks into the installing groove is rationally designed, so that the sufficient safe distance is remained when the LGP is heated and expended, thereby avoiding the LGP bumping into and damaging the connector.

10 Claims, 5 Drawing Sheets

CONNECTOR, PCB FOR LED LIGHT BAR AND LED LIGHT BAR

TECHNICAL FIELD

The present invention relates to the field of liquid crystal display, and more particularly to a connector, PCB for LED light bar and LED light bar.

BACKGROUND

The LED light bar is one of the key components of the back light module, and is a light source which provides sufficient brightness for a liquid crystal display (LCD) device and can display images.

The LED light bar is connected to the external line through the connector, as shown in FIG. 1, an LED light bar includes a connector arranged on a PCB 4 and an LED 2. The traditional connector on the LED light bar is directly welded on the PCB 4 through a weld leg 11 on a shell 1 and is on the same surface as the LED 2. The height of the LED 2 is generally 0.5~1.2 mm, and the height of the shell 1 of the connector is 2 mm which is higher than that of the LED 2. Thus, as shown in FIG. 2, when a Light Guide Plate (LGP) 7 is arranged, the position of the LGP 7 corresponding to the shell 1 of the connector is cut to avoid the protrudent connector. Such cutting may increase the processing step, thereby increasing the processing cost; in addition, a sufficient distance shall be remained during design to avoid the LGP 7 heated and expended bumping into and damaging the connector. However, the sufficient distance is disadvantageous for the design of the narrow frame.

SUMMARY

One aim of the present invention is to provide a connector, PCB for LED light bar and LED light bar which can avoid cutting the LGP and can simplify the processing technology.

Another aim of the present invention is to prevent the LGP heated and expanded from bumping into and damaging the connector.

The aim of the present invention is achieved by the following technical schemes: a connector comprises a shell and weld legs and stitches fixed on the shell. The weld legs are arranged on the side of the shell and are higher than the bottom surface of the shell Preferably, the stitches are arranged on the side of the shell and are higher than the bottom surface of the shell, so that the stitches are of the same height as the PCB surface or higher than the PCB surface, thereby facilitating the line connection between the stitches and the PCB.

Preferably, the connector comprises two weld legs which are arranged on the two opposite sides on the shell. The two weld legs are respectively arranged on the two opposite sides, so that the connector welded on the PCB is firmer.

Preferably, the stitches are arranged on another side except the two sides on which weld legs are arranged, so that the stitches do not interfere with weld legs, and the side on which the stitches are arranged is in the direction of the LED of the LED light bar. Most of the lines of the PCB are arranged in this area to facilitate the connection between the stitches and the line of the PCB.

Preferably, the stitches are arranged at the same height of the weld legs, so that the stitches and the weld legs simultaneously contact the PCB surface, thereby facilitating the connection between stitches and lines on the PCB, and simultaneously ensuring that the weld legs can contact the weld spots to facilitate the welding.

Preferably, the connector is provided with a receptacle for accommodating a male connector, and the receptacle is arranged on the bottom surface or on the side of the connector. The proper arrangement position of the receptacle can be selected in accordance with the arrangement of the installing groove on the PCB.

A PCB for LED light bar which is provided with the installing groove for inserting the connector. Weld spots for welding the weld legs of the connector are arranged at the edge of the installing groove. The depth that the connector is inserted into the installing groove is consistent with the height of the weld legs relative to the bottom surface.

Preferably, the installing groove is a through groove, and the through groove can rationally design the depth that the connector sinks into the slot in accordance with the requirement, and the processing of the through groove is convenient.

Preferably, the installing groove is arranged at the end of the PCB to connect to the line of the male, thereby avoiding the interference between the lines and the LED.

Preferably, the installing groove is an open groove with opening. The open installing groove has an opening which facilitates arranging the connector and simultaneously facilitates arranging the receptacle on the side of the connector which is located on the opening of the installing groove.

Preferably, the installing groove is a closed slot with around closed. The closed installing groove firmly arranges the connector on the PCB and arranges the receptacle on the bottom surface of the connector.

An LED light bar comprises the connector and the PCB, wherein, the connector is inserted into the installing groove of the PCB, and weld legs of the connector is fixed by welding on the weld spots at the edge of the installing groove on the PCB. The depth that the connector is inserted into the installing groove is consistent with the height of the weld legs of the connector relative to the bottom surface.

Because the present invention arranges the weld legs of the connector on positions which are higher than the bottom surface of the shell and arranges the installing groove corresponding to the bottom shape of the connector on the PCB, the bottom of the connector can be arranged in the installing groove, thus, the protrusion height of the connector in the LED light bar is reduced, thereby avoiding the connector bumping into the LGP. The LGP is not cut again when installing the LGP, so that the processing step is reduced, and the production cost is reduced. In addition, the depth that the connector sinks into the installing groove is rationally designed and the sufficient safe distance can be remained when the LGP is heated and expended, in order to prevent the LGP from bumping into and damaging the connector, thereby avoiding affecting the design of the narrow frame.

Wherein: 1. Shell; 2. LED; 4. PCB; 7. Light guide plate; 10. Installing groove; 11. Weld legs; 12. Stitches; 15. Male connector; 16. Receptacle; 17. Trips.

DETAILED DESCRIPTION

The present invention will further be described in detail in accordance with the figures and the preferred examples.

The connector of the present invention comprises: weld legs and stitches arranged on the shell, wherein, the weld legs are arranged on the side of the shell of the connector and are higher than the bottom surface. The PCB for the LED light bar of the present invention comprises: the LED arranged on the PCB side by side and the installing groove arranged on the PCB for installing the connector. In the present invention, because the weld legs of the connector are arranged on positions which are higher than the bottom surface of the shell, and the installing groove corresponding to the bottom shape of the shell of the connector is arranged on the PCB, the bottom of the connector can be arranged in the installing groove, thus the protrusion height of the connector in the LED light bar will be reduced and the connector will not bump into the LGP when installing the LGP. Therefore, the LGP is not cut again, thus the processing step is reduced, and the production cost is reduced. In addition, the depth that the connector sinks into the installing groove is rationally designed, and the sufficient safe distance can be remained when the LGP is heated and expended, in order to prevent the LGP from bumping into and damaging the connector, thereby avoiding affecting the design of the narrow frame.

Figure 1:
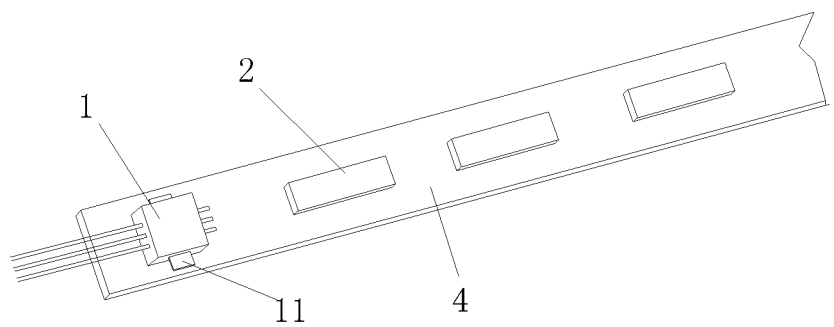
FIG. 1 is a structural diagram of an existing connector and LED light bar.
Figure 2:
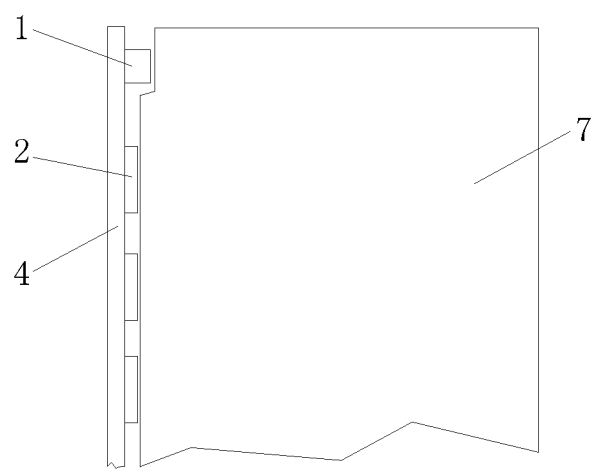
FIG. 2 is a matching diagram of an LED light bar, the connector thereof and an LGP in existing technology.
Figure 3:
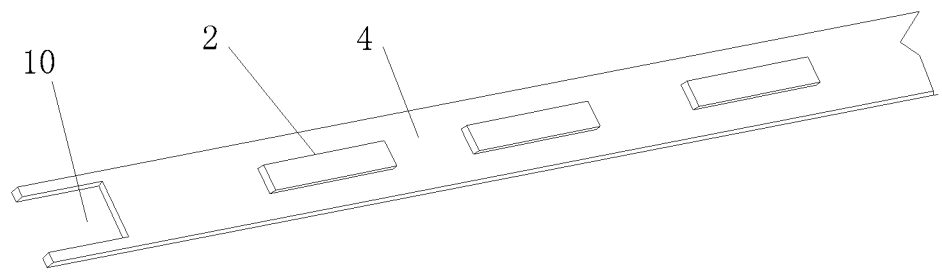
FIG. 3 is a structural diagram of an LED light bar of an example of the present invention.

FIG. 3 to FIG. 8 are the first example of the present invention, wherein:

As shown in FIG. 3, the PCB for the LED light bar comprises: the LED 2 arranged on the PCB 4 side by side, and the installing groove 10 arranged at the end of the PCB. Wherein, the installing groove 10 is arranged as a through groove to facilitate the processing, and the through groove is not limited by the height of the weld legs of the connector; in addition, an opening is arranged at one end of the install groove 10, that is the installing groove 10 is an open groove, which facilitates the installation of the connector.

Figure 4:
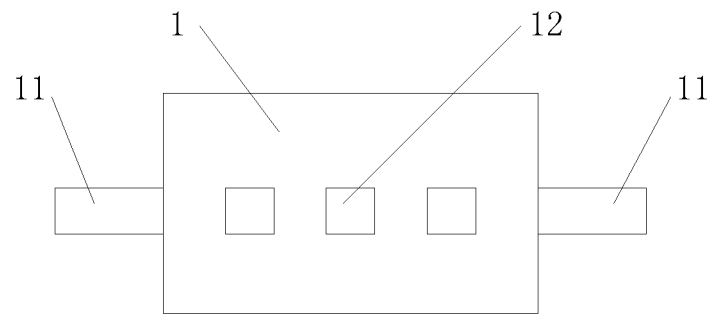
FIG. 4 is a structural diagram of a connector of an example of the present invention.

As shown in FIG. 4, the structure of the connector is generally of square shape, and weld legs 11, stitches 12 and the receptacle (not shown in the figure) are arranged on the shell of square shape. Weld legs 11 and stitches 12 are arranged on the side of the shell and are higher than the bottom surface, wherein, the two weld legs 11 are respectively located on two opposite sides, and stitches 12 are located on another side except sides on which weld legs are arranged. Wherein, the height that the weld legs 11 and stitches 12 is higher than the bottom of the connector is consistent with the thickness of the PCB 4, so that the depth that the shell 1 sinks into the installing groove 10 is consistent with the thickness of the PCB, thereby avoiding the connector protruding from the back of the PCB 4. The designed height of the stitches 12 is consistent with the height of the connector, the aim is to properly locate the stitches 12 on the arrangement surface of lines of the PCB 4, so that the stitches are connected to the lines of the PCB 4.

Figure 5:
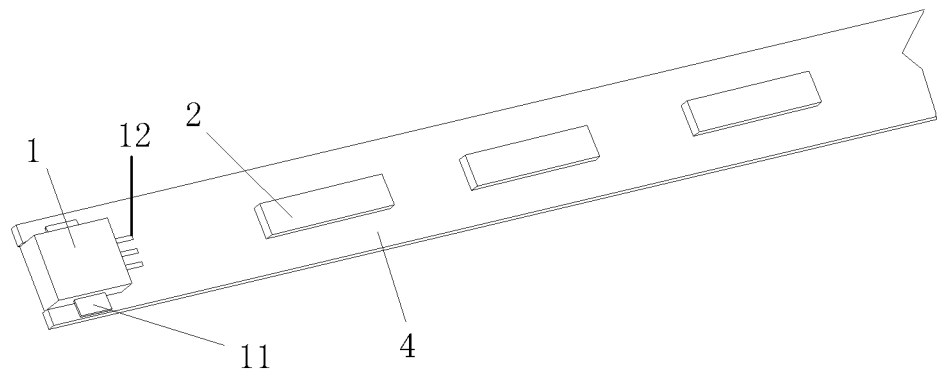
FIG. 5 is a structural diagram of a connector arranged on the LED light bar of an example of the present invention.

FIG. 5 shows the structure of the connector arranged on the LED light bar, wherein, the bottom of the shell 1 of the connector sinks into the installing groove 10, the weld legs 11 on both sides of the shell are fixed by welding on the weld spots at the edge of the installing groove 10 of the PCB, and the stitches 12 are connected to lines of PCB 4.

Figure 6:
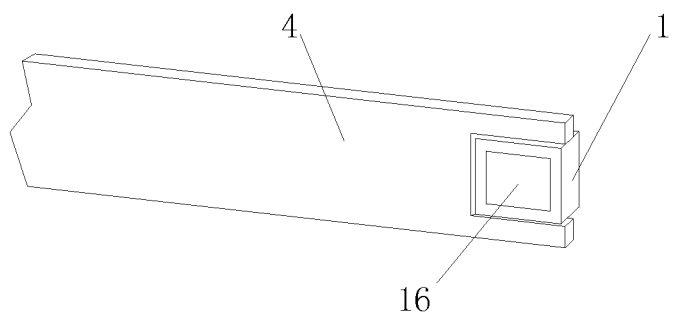
FIG. 6 is a structural diagram of the slot arrangement of a connector of an example of the present invention.
Figure 7:
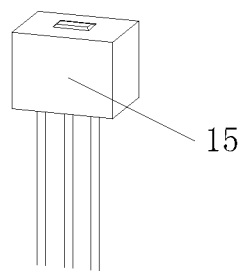
FIG. 7 is a structural diagram of a male of a connector of an example of the present invention.

As shown in FIG. 6, a receptacle 16 of the connector is arranged at the bottom of the shell 1, and is of square slot shape. FIG. 7 shows the structure of a male connector 15, and the shape of the male connector 15 corresponds to that of the receptacle 16.

Figure 8:
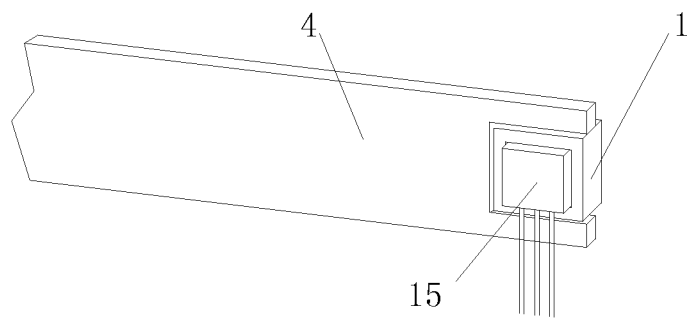
FIG. 8 is a structural diagram of an installed connector, male and LED light bar of an example of the present invention.

As shown in FIG. 8, the male connector 15 can be inserted into the receptacle 16 to achieve the connection between the connector and the external line, so that the LED light bar is connected to the external line through the connector.

Figure 9:
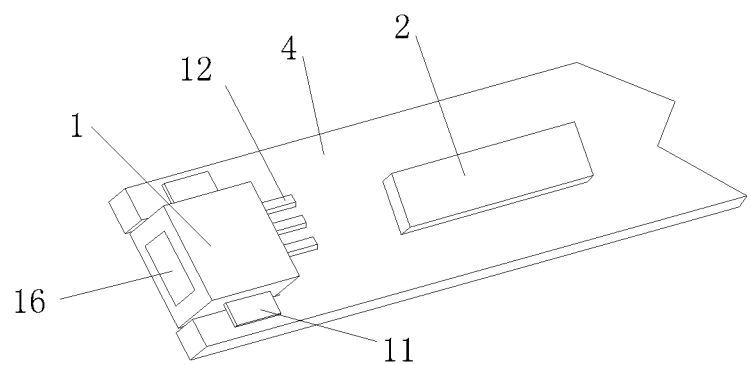
FIG. 9 is the second example of the present invention.
Figure 10:
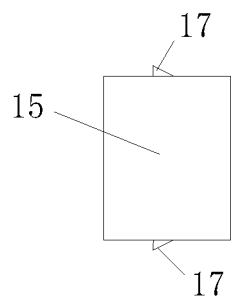
FIG. 10 is a structural diagram of a male of the second example of the present invention.

FIG. 9 to FIG. 10 show the second example of the present invention:

The second example is different from the first example in that the receptacle 16 is arranged on the side of the shell 1, and the side is located on the opening of the installing groove 10, so that the male connector 15 can be inserted from the end of the PCB 4 rather than from the back of the PCB 4, thereby preventing excessive protrusion formed on the back of the PCB 4 to affect the installation of other components, and then affect the narrowing design of components like rubber frames, etc. The shape of the male connector 15 corresponds to that of the receptacle 16, the male connector 15 is provided with trips 17, and accordingly, corresponding necks are arranged in the receptacle 16. When the male connector 15 is inserted into the receptacle 16, the trips 17 retracts during entry and bounces after being in place to match with the necks, so that the male connector 15 is firmly fixed on the connector. Of course, the connection mode between the male connector 15 and the connector is not limited to this method.

Figure 11:
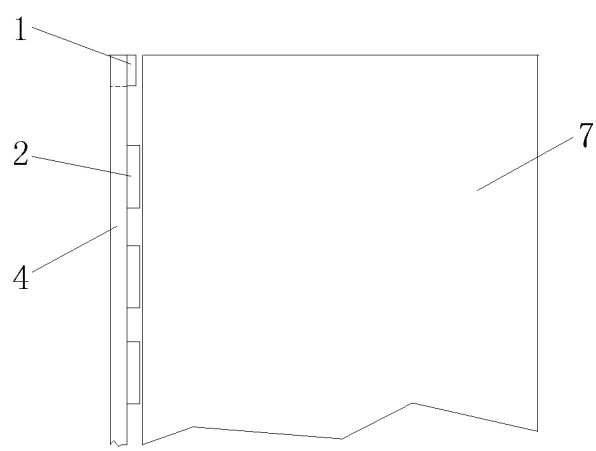
FIG. 11 a matching diagram of an LED light bar, the connector thereof and an LGP of the first example and the second example of the present invention.

FIG. 11 shows the matching state with the LGP of the first example and the second example of the present invention, take the thickness of the PCB 4 of 1 mm, the height of the shell 1 of the connector of 1.8 mm and the height of the LED 2 of 1 mm for example, because the shell 1 is arranged in the installing groove 10, and the height of the weld legs 11 of the shell 1 is consistent with the thickness of the PCB 4, the connector sinks for 1 mm in the installing groove 10, thus, only 0.8 mm of the protrusion height of the connector from the PCB 4 is remained, and then the connector will not interfere with the installation of the LGP 7, and the LGP 7 heated and expended will not bump into the shell of the connector, so that the connector is safe.

Figure 12:
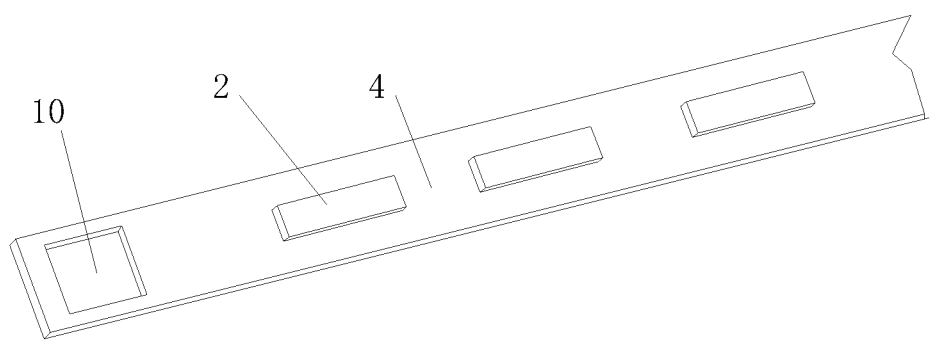
FIG. 12 is a structural diagram of an LED light bar of the third example of the present invention.
Figure 13:
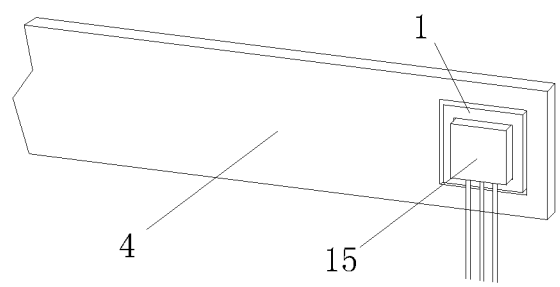
FIG. 13 is the third example of the present invention.

FIG. 12 to FIG. 13 are the third example of the present invention:

The third example is different from the first example in that the installing groove 10 of the PCB 4 for the LED light bar in the example is an closed groove which is closed around without opening. The aim of the design is to increase the reliability of the connector arranged on the PCB 4, and facilitate the installation and the welding. However, the receptacle 16 of the connector of such design can only be arranged on the bottom of the shell of the connector, and the male connector 15 is inserted from the back of the PCB 4.

Figure 14:
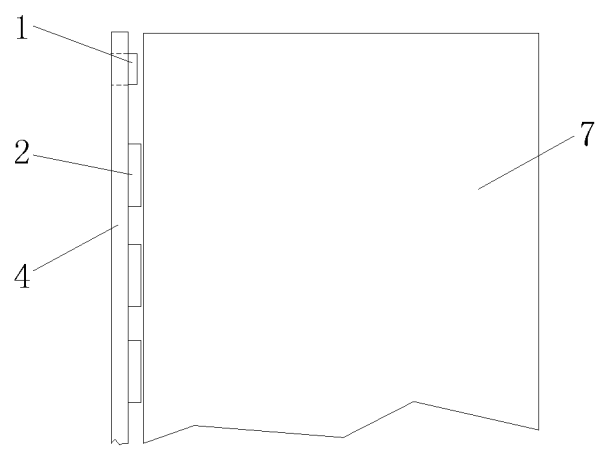
FIG. 14 is a matching diagram of an LED light bar, the connector thereof and an LGP of the third example of the present invention.

FIG. 14 is the matching state of a PCB for LED light bar, the connector thereof and the LGP 7 of the third example. As shown in the figure, the bottom of the shell 1 of the connector sinks into the PCB 4, thus the LGP 7 will not be interfered, and the sinking depth of the shell 1 of the connector will not bump into the connector when the LGP is heated and expended, thereby avoiding the damage possibility of the connector.

In the example of the present invention, the designed height of the weld legs 11 of the connector is not necessarily consistent with the thickness of the PCB 4, and for PCBs 4 of different thicknesses, LEDs 2 of different heights and connectors of different heights, the height of corresponding weld legs 11 shall be designed, so that the depth that the connector sinks into the PCB 4 is sufficient to avoid the arrangement of the LGP 7, and can prevent the LGP 7 heated and expended from bumping into and damaging the connector. Accordingly of course, the installing groove 10 is also not necessarily the through groove. However, the through groove is usually easy to process, and will not affect the sinking depth of the connector. In case that the installing groove 10 is a through groove, the depth that the connector sinks into the PCB 4 is only related to the design height of the weld legs 11.

In the example of the present invention, shapes of the connector and the corresponding installing groove on the LED light bar are not limited to the square shape shown in the figure, for example, the column and other polygons.

The present invention is described in detail in accordance with the above contents with the specific preferred examples. However, this invention is not limited to the specific examples. For example, shapes of the connector and the corresponding installing groove on the LED light bar are also not limited to the square shape shown in the figure, for example, the column etc.; another example is that, in the first example and the second example, the opening direction and the position of the installing groove are also not limited to that shown in the figure; and in the third example, the position of the installing groove is not limited to that shown in the figure, other feasible positions on the PCB may also be accepted. For the ordinary technical personnel of the technical field of the present invention, on the premise of keeping the conception of the present invention, the technical personnel can also make simple deductions or replacements, and all of which should be considered to belong to the protection scope of the present invention.

The invention claimed is:

1. A PCB for LED light bar, the PCB comprising an installing groove for accommodating a connector, and weld spots, wherein the connector comprises a shell, weld legs fixed to the shell, and stitches fixed to the shell, the weld legs being arranged on a side of the shell and are displaced from a bottom of the shell, the weld spots welding weld legs of the connector, the weld spots being arranged at an edge of the installing groove; wherein a depth that the connector sinks into the installing groove is consistent with the height of the weld legs of the connector relative to the bottom surface.

2. The PCB for LED light bar of claim 1, wherein the installing groove is a through groove in a thickness of the PCB.

3. The PCB for LED light bar of claim 1, wherein the installing groove is arranged at an end of the PCB.

4. The PCB for LED light bar of claim 3, wherein the installing groove is an open groove with an open side surface.

5. The PCB for LED light bar of claim 3, wherein the installing groove is a closed groove with all side surfaces closed.

6. An LED light bar comprising a connector and a PCB;
   wherein the connector is inserted into a installing groove of the PCB; weld legs of the connector being welded on weld spots, the connector comprising a shell, weld legs fixed to the shell, and stitches fixed to the shell, the weld legs being arranged on a side of the shell and are displaced from a bottom of the shell; and
   wherein the PCB comprises the installing groove for accommodating the connector, and weld spots for welding weld legs of the connector, the weld spots being arranged at an edge of the installing groove.

7. The LED light bar of claim 6, wherein the installing groove is a through groove in a thickness of the PCB.

8. The LED light bar of claim 6, wherein the installing groove is arranged at an end of the PCB.

9. The LED light bar of claim 8, wherein the installing groove is an open groove with an open side surface.

10. The LED light bar of claim 8, wherein the installing groove is a closed groove with all side surfaces closed.

* * * * *